United States Patent
Salsman

(10) Patent No.: US 9,440,844 B2
(45) Date of Patent: Sep. 13, 2016

(54) OPTICAL AND INFRARED IMAGING SYSTEM

(71) Applicant: Semiconductor Components Industries, LLC, Phoenix, AZ (US)

(72) Inventor: Kenneth Edward Salsman, Pleasanton, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 282 days.

(21) Appl. No.: 13/854,834

(22) Filed: Apr. 1, 2013

(65) Prior Publication Data

US 2015/0187828 A1 Jul. 2, 2015

Related U.S. Application Data

(60) Provisional application No. 61/619,364, filed on Apr. 2, 2012.

(51) Int. Cl.
*G01J 1/00* (2006.01)
*B81B 3/00* (2006.01)
(Continued)

(52) U.S. Cl.
CPC ........... *B81B 3/0029* (2013.01); *G06F 3/0304* (2013.01); *H01L 27/14629* (2013.01);
(Continued)

(58) Field of Classification Search
CPC .... G06F 3/0304; G01J 3/0229; G01J 3/2823
See application file for complete search history.

(56) References Cited

U.S. PATENT DOCUMENTS

2005/0135724 A1 6/2005 Helvajian et al.
2010/0038542 A1* 2/2010 Carey ..................... G01J 3/36
250/338.4

(Continued)

FOREIGN PATENT DOCUMENTS

WO 2012150557 11/2012
WO 2012172363 12/2012

OTHER PUBLICATIONS

"Optomechanical Uncooled Infrared Imaging System:Design, Microfabrication, and Performance", Journal of Microelectromechanical Systems, vol. 11, No. 2, Apr. 2002, pp. 136-146, to Zhao et al.*

(Continued)

*Primary Examiner* — David J Makiya
*Assistant Examiner* — Kenneth J Malkowski
(74) *Attorney, Agent, or Firm* — Treyz Law Group, P.C.; Andrew C. Milhollin

(57) ABSTRACT

Imaging systems may include an image sensor and a microelectromechanical systems array. The microelectromechanical systems array may be mounted over the image sensor. The system may include an infrared lens that focuses infrared light onto a first surface of the microelectromechanical systems array and a visible light source that illuminates an opposing second surface of the microelectromechanical systems array. The image sensor may capture images of the opposing second surface of the microelectromechanical systems array. The system may include processing circuitry that generates infrared images of a scene using the captured images of the microelectromechanical systems array. Microelectromechanical systems elements in the microelectromechanical systems array may change position or shape in response to infrared light that is absorbed by the microelectromechanical systems elements. Each microelectromechanical systems element may include infrared absorbing material on a metal layer. The system may include optical elements that focus visible light onto the image sensor.

16 Claims, 4 Drawing Sheets

(51) Int. Cl.
*G06F 3/03* (2006.01)
*H01L 27/146* (2006.01)
*H04N 5/225* (2006.01)
*H04N 5/33* (2006.01)
*H04N 9/04* (2006.01)
*G01J 3/02* (2006.01)
*G01J 3/28* (2006.01)

(52) U.S. Cl.
CPC ............ *H04N5/2258* (2013.01); *H04N 5/332* (2013.01); *H04N 9/045* (2013.01); *B81B 2201/032* (2013.01); *G01J 3/0229* (2013.01); *G01J 3/2823* (2013.01)

(56) References Cited

U.S. PATENT DOCUMENTS

2010/0127172 A1* 5/2010 Nikoobakht .......... B81B 3/0081
250/332
2011/0115919 A1* 5/2011 Hiramoto et al. ............ 348/164
2011/0285995 A1 11/2011 Tkaczyk et al.
2011/0316982 A1* 12/2011 Steurer .................. G03B 11/04
348/49
2014/0078509 A1* 3/2014 Moshe .......................... 356/452

OTHER PUBLICATIONS

"Polymer-Ceramic MEMS Bimorphs as Thermal Infrared Sensors", p. 1-94, UC Berkley Electronic Theses and Disserations, to Warren (2010).*

Thermopile infrared sensor with precisely patterned high-temperature resistant black absorber layer, Sensor + Test Conference 2009, p. 197-202 to Ihring et al.*

* cited by examiner

OPTICAL AND INFRARED IMAGING SYSTEM

This application claims the benefit of provisional patent application No. 61/619,364, filed Apr. 2, 2012, which is hereby incorporated by reference herein in its entirety.

BACKGROUND

This relates generally to imaging systems, and more particularly, to infrared imaging systems.

Conventional silicon imaging devices have a bandgap limit near a wavelength of one micron, above which they lose their ability to generate electrons from interactions with photons. These conventional devices therefore have limited capability of detecting infrared radiation from the bandgap limit through the infrared spectral region.

This has resulted in the development of two different specialized infrared imaging technologies, exotic semiconductors such as Mercury Cadmium Telluride (HgCdTe) semiconductors, Indium Antimonide semiconductors, etc. or microelectromechanical systems (MEMS) based bolometers. MEMS based bolometers typically include metal layers with differing coefficients of expansion that flex when infrared radiation is absorbed. This flexing changes the capacitance of the MEMS devices thereby allowing detection of infrared radiation by detecting the changes in capacitance.

Exotic semiconductors can have a prohibitively high cost for mass production of infrared imaging systems and cannot capture visible light images. MEMS-based bolometer devices also cannot capture visible light images.

It would therefore be desirable to be able to provide improved infrared imaging systems.

DETAILED DESCRIPTION

Electronic devices such as digital cameras, computers, cellular telephones, and other electronic devices include image sensors that gather incoming light to capture an image. A microelectromechanical systems (MEMS) device may be mounted over the image sensor. Microelectromechanical systems elements in the MEMS device may change position due to absorption of infrared light. The image sensor may detect incoming infrared light by detecting the changes in position of the MEMS elements. A beam splitter may be included in the electronic device operable for switchably capturing visible light images through a lens and capturing images of the MEMS device for forming infrared images.

The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements. The image pixels may be arranged in pixel rows and pixel columns.

Figure 1:
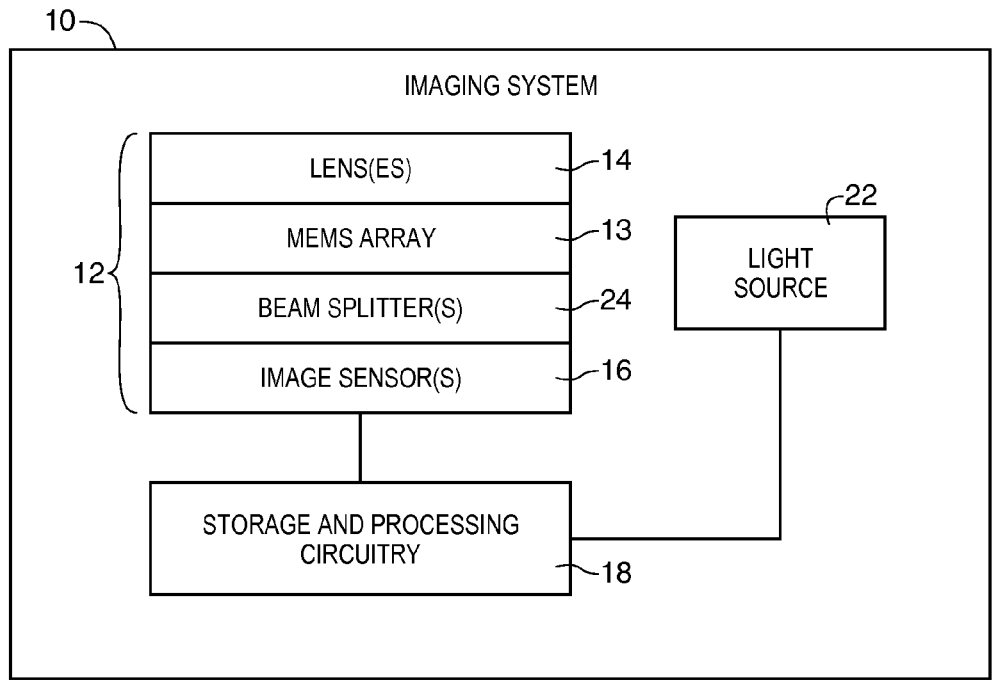
FIG. 1 is a diagram of an illustrative imaging system for optical and infrared imaging in accordance with an embodiment of the present invention.

FIG. 1 is a diagram of an illustrative imaging system such as an optical and infrared imaging system. System 10 of FIG. 1 may be a portable electronic device such as a camera, a cellular telephone, a video camera, a computer, or other electronic device. System 10 may include a camera module such as camera module 12, a light source such as light source 22, and processing circuitry such as storage and processing circuitry 18. Storage and processing circuitry 18 may be used to operate camera module 12, to operate light source 22, and/or to process image data such as infrared image data and optical image data from camera module 12.

As shown in FIG. 1, camera module 12 may include one or more image sensor such as image sensor 16. Image sensor 16 may include an array of image pixels such as complementary-metal-oxide-semiconductor (CMOS) image pixels, charged-coupled-device (CCD) image pixels or other image pixels.

Camera module 12 may also include a microelectromechanical systems device such as MEMS array 13. MEMS array 13 may include an array of MEMS elements that change position and/or shape in response to absorption of infrared light. Image sensor 16 may be configured to capture images of MEMS array 13. Processing circuitry associated with image sensor 16 and/or storage and processing circuitry 18 may be used to generate infrared images of a scene using the captured images of MEMS array 13.

If desired, camera module 12 may include a light source such as light source 22 that illuminates MEMS array 13. Light source 22 may direct light toward a surface of MEMS array 13. Infrared light may illuminate a first side of MEMS array 13 and light from light source 22 may illuminate an opposing side of MEMS array 13. Image sensor 16 may capture images of light from light source 22 that is reflected from the opposing side of MEMS array 13. Light source 22 may directly illuminate MEMS array 13 or one or more light redirecting structures such as one or more of lenses 14 and/or one or more of beam splitters 24 may direct light from light source 22 onto MEMS array 13.

Lenses 14 may include one or more infrared focusing lenses and, if desired, one or more visible light focusing lenses. One or more infrared focusing lenses may focus infrared light onto MEMS array 13.

Camera module 12 may include one or more beam splitters 24. Beam splitters 24 may include a beam splitter that redirects light from light source 22 onto a surface of MEMS array 13. Beam splitters 24 may, if desired, include an additional beam splitter that redirects visible light from a scene onto image sensor 16. One or more beam splitters may be movable beam splitter that can be moved to switch camera module 12 between imaging modes of operation such as a visible light imaging mode to an infrared imaging mode.

Processing circuitry 18 may include one or more integrated circuits (e.g., image processing circuits, microprocessors, storage devices such as random-access memory and non-volatile memory, etc.) and may be implemented using components that are separate from camera module 12 and/or components that form part of camera module 12 (e.g., circuits that form part of an integrated circuit that includes image sensor 16). Optical images of MEMS array 13 may be processed using processing circuitry 18 to form infrared images of a scene. Processed data may, if desired, be provided to external equipment (e.g., a computer or other device) using wired and/or wireless communications paths coupled to processing circuitry 18.

Figure 2:
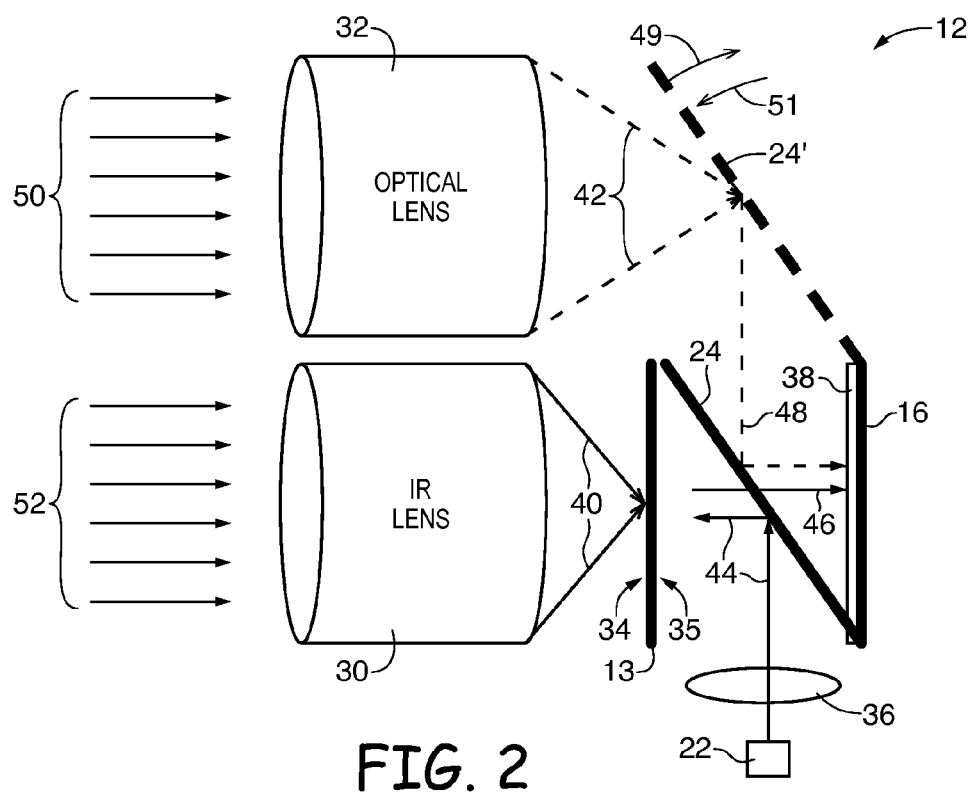
FIG. 2 is a schematic side view of an illustrative camera module in accordance with an embodiment of the present invention.

As shown in FIG. 2, camera module 12 may include an infrared lens such as infrared (IR) lens 30. IR lens 30 may focus incoming infrared light 52 onto surface 34 of MEMS array 13 (as indicated by arrows 40). However, this is merely illustrative. If desired, other optical collection and focusing structures such as a Cassegrain optical system may be used to focus infrared light onto surface 34 of MEMS array 13, thereby creating a infrared image on surface 34 of MEMS array 13.

Light source 22 (e.g., a light-emitting diode or other light source) may direct light such as visible light through a lens such as lens 36 onto a beam splitter such as beam splitter 24. Beam splitter 24 may then redirect the light from light source 22 onto an opposing surface such as surface 35 of MEMS array 13 (as indicated by arrows 44). The light that is redirected onto surface 35 of MEMS array 13 may then reflect from surface 35 and pass through beam splitter 24 and onto image sensor 16 (as indicated by arrow 46). Image sensor 16 may be configured to capture images of surface 35 using the light that has been reflected from surface 35 of MEMS array 13 through beam splitter 24. MEMS elements in MEMS array 13 may be configured to absorb infrared light 52 that has been focused by lens 30 and to change position and/or shape due to the absorption of the infrared light.

Infrared images of a scene may be generated (e.g., using processing circuitry 18) using the captured images of MEMS array 13 by detecting the changes in position and/or shape of the MEMS elements in the captured images.

If desired, additional structures such as interfering structures 38 may be included in the path along which light travels from surface 35 of MEMS array 13 to image sensor 16. For example, structures 38 may include a Fabry-Perot etalon or other light phase imaging or interferometry structures. In this type of configuration, image sensor 16 may capture phase images or interferometric images that contain information about slight movements of the MEMS elements in MEMS array 13. In this way, shifts in position of the MEMS elements to within fractions of a wavelength of the visible illumination light being used can be measured, thereby providing a highly sensitive measurement of the amount of infrared light that has been absorbed by each MEMS element. However, this is merely illustrative. If desired, camera module 12 may be provided without any additional structures 38.

The arrangement of FIG. 2 in which beam splitter 24 is used to direct light form light source 22 onto MEMS array 13 is merely illustrative. If desired, other arrangements may be used. For example, lenses may be arranged in camera module 12 to illuminate MEMS array 13 at an angle from perpendicular and, if desired, a field lens may be used to direct reflected light from MEMS array 13 onto image sensor 16. As another example, MEMS elements in MEMS array 13 may have curved optical surfaces. In this type of configuration, camera module 12 may be provided without a lens that focuses light from MEMS elements onto image sensor 16.

To further enhance infrared imaging performance, the reflected light from the MEMS elements may be arranged to move across multiple image pixels on image sensor 16 when the MEMS elements absorb incident infrared light. In this type of arrangement, processing circuitry 18 may be used to perform super resolution imaging operations in order to extract positioning data that describes the positions of the MEMS elements from captured images of MEMS array 13. In this way, the measuring accuracy of the MEMS elements positions and shapes may be increased, thereby increasing the accuracy of the intensity measurement of the incident infrared photons.

If desired, optical (visible light) imaging components may also be included in camera module 12. One or more optical lenses such as lens 32 may be used to focus visible light 50 for camera module 12. Lens 32 may focus visible light 50 onto a mirror or a beam splitter such as beam splitter 24' (as indicated by dashed arrows 42). In an optical imaging mode, beam splitter 24' may redirect visible light onto beam splitter 24 (as indicated by dashed arrow 48). The visible light that has been redirected onto beam splitter 24 may then be redirected onto image sensor 16. Image sensor 16 may capture an image of a scene using image pixels on image sensor 16 to convert visible light from beam splitter 24 into electric charges and generate image signals based on those electric charges.

If desired, beam splitter 24' may be a movable beam splitter that can be moved and or rotated (e.g., in directions 49 and 51). In this way, visible light may be switchably directed onto image sensor 16 or away from image sensor 16 depending on the mode of operation of camera module 12. In a visible light imaging mode, light source 22 may be turned off and beam splitter 24' (and beam splitter 24) may direct visible light onto image sensor 16. In an infrared imaging mode, light source 22 may be turned on and beam splitter 24' may be moved (e.g., in direction 49) so that visible light from lens 32 is directed away from image sensor 16 and light from light source 22 that has reflected off of MEMS array 13 is imaged by image sensor 16. Beam splitters 24 and 24' may therefore switchably direct light from optical lens 32 and the MEMS array 13 onto image sensor 16.

Figure 3:
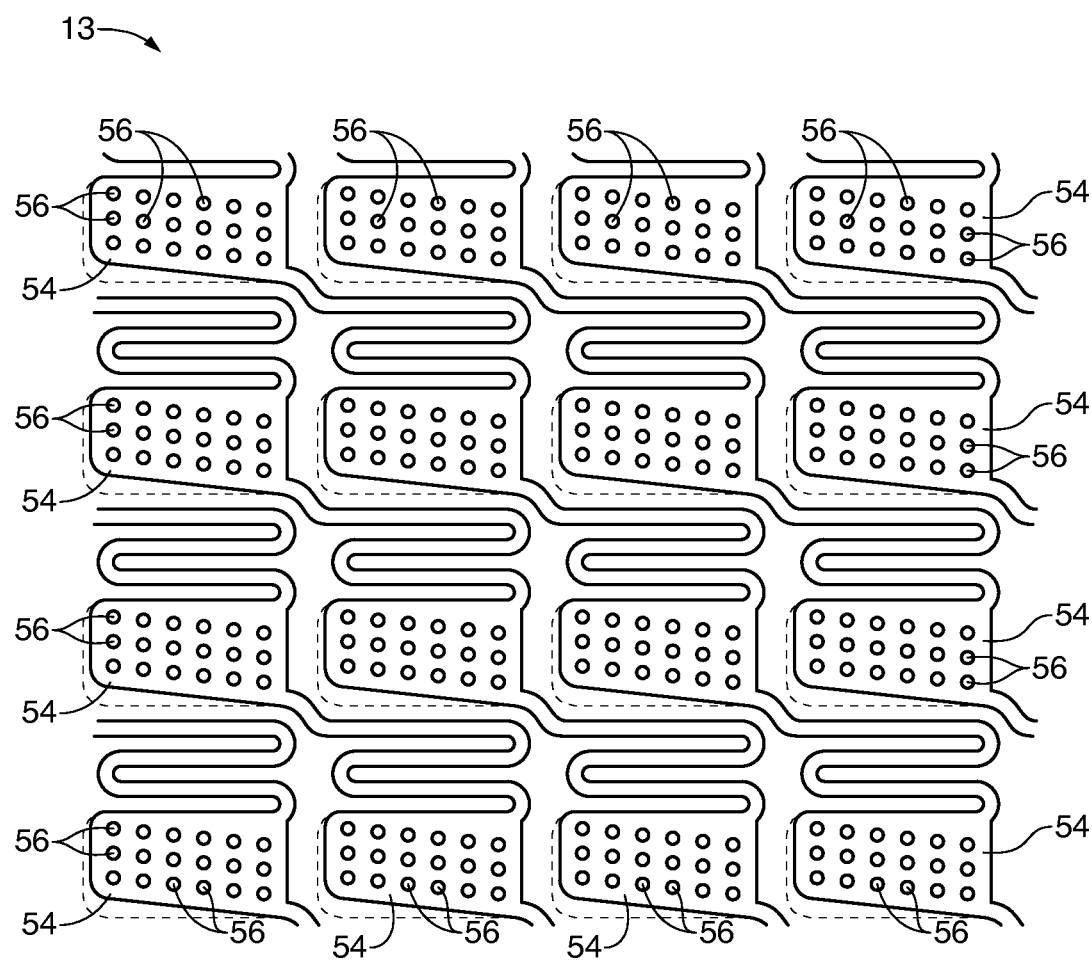
FIG. 3 is a top view of an illustrative microelectromechanical systems device that may be used in an infrared and optical imaging system in accordance with an embodiment of the present invention.

FIG. 3 is a top view of a portion of surface 34 of MEMS array 13. As shown in FIG. 3, MEMS array 13 may include a plurality of MEMS elements 54. MEMS elements 54 may be formed form metal or other materials and may have infrared absorbing material such as infrared absorbing material 56 on a surface of the metal. In the example of FIG. 3, IR absorbing material 56 is patterned on the surface of metal support structures. MEMS elements 54 may move, actuate, bend, flex, rotate, or otherwise change their position and/or shape in response to temperature changes or charge generation generated by infrared light that has been absorbed by material 56 on each element 54. Differences in the amount of change in shape and/or position from element to element may be used to map the distribution of infrared light that has fallen on MEMS array 13.

Figure 4:
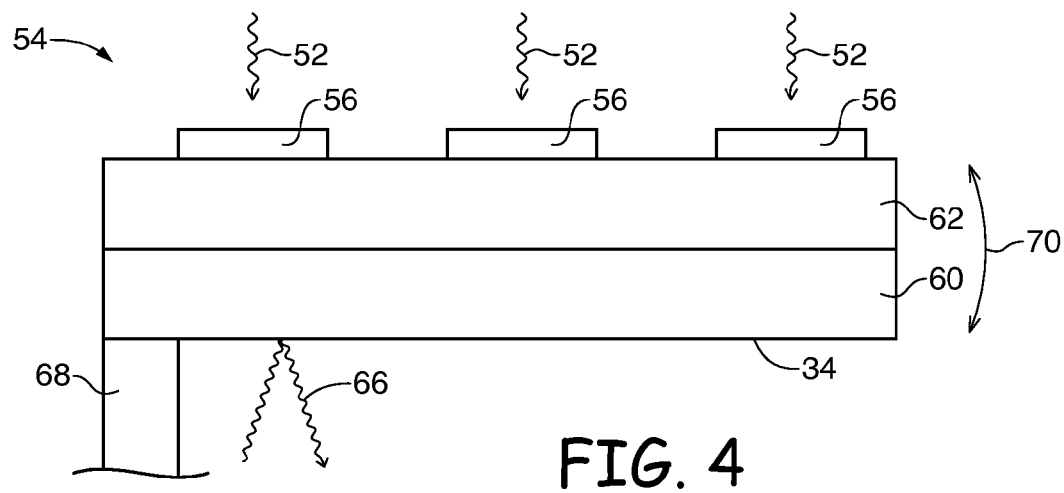
FIG. 4 cross-sectional side view of an illustrative microelectromechanical systems element of a microelectromechanical systems device of the type shown in FIG. 3 showing how the microelectromechanical systems may rotate in response to incoming infrared light in accordance with an embodiment of the present invention.
Figure 5:
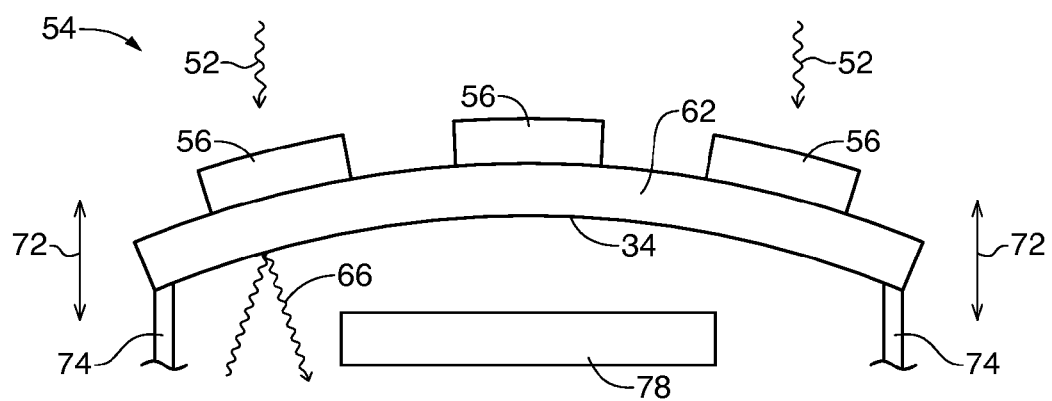
FIG. 5 cross-sectional side view of an illustrative microelectromechanical systems element of a microelectromechanical systems device of the type shown in FIG. 3 showing how the microelectromechanical systems may actuate away from or towards an image sensor in response to incoming infrared light in accordance with an embodiment of the present invention.

Material 56 on MEMS elements 54 may be designed to absorb thermal radiation in a selected wavelength band region, such as from 8 microns to 15 microns in wavelength (as an example). FIGS. 4 and 5 show two exemplary embodiments of MEMS elements 54.

As shown in FIG. 4, MEMS elements 54 may be formed from a first metal layer such as metal layer 62 formed on a second metal layer such as metal layer 60. Metal layer 60 may have a coefficient of thermal expansion that is different from the coefficient of thermal expansion of metal layer 62. A patterned layer of IR absorbing material 56 may be formed on metal layer 62. IR absorbing material 56 may absorb incoming infrared photons 52 within the selected wavelength region and convert the absorbed photons into internal heat. The heat generated in material 56 may be transferred to layers 62 and 60. Because layers 60 and 62 have different coefficients of thermal expansion, this heat may cause MEMS element 54 to bend or flex in a given direction by an amount proportional to the number of IR photons 52 that element has absorbed.

In the example of FIG. 4, one edge of MEMS element 54 is attached to support structure 68 so that MEMS element 54 will rotate as indicated by arrows 70 when more or less infrared light 52 is absorbed by material 56. The amount of rotation of element 54 may be detected using visible light 66 (e.g., from light source 22) that reflects from interior surface 34 of layer 60 and onto image sensor 16. Because each MEMS element 54 will receive an amount of infrared light that depends on the amount of infrared light at a corresponding location in a scene, the measured deflection of MEMS elements 54 can be converted into an infrared image (sometimes referred to as a heat image) of the scene.

In the example of FIG. 5, MEMS element 54 is configured as an electrical field MEMS. In this type of configuration, MEMS element 54 is formed from a single metal layer such as layer 62 with a patterned coating of IR absorbing material 56 on the scene-facing side of MEMS element 54. MEMS element 54 may include a stationary electrode such as electrode 78 mounted at a distance from layer 62. Electrical charges may be formed on metal layer 62 and electrode 78. In this type of configuration, material 56 may be formed from a material that converts incoming infrared photons 52 into electrons, thereby increasing the charge on layer 62 proportionally to the amount of infrared light 52 received. The increased charge on layer 62 may generate a force on layer 62 due to the charges on electrode 78. In response to this force, elements 54 may therefore bend, flex, actuate, move, rotate, or otherwise change position and/or shape based on the amount of infrared light 52 that has been absorbed.

If desired, electrode 78 may be used to drive layer 62 into oscillation such that layer 62 moves in a regular cycle away from and toward stationary electrode 78 as indicated by arrows 72. In this type of configuration, the motion of metal layer 62 will alter its frequency and magnitude of oscillation as additional charges are built up through the conversion of IR photons 52 into additional electrical charge. This mode of operation may allow MEMS elements 54 to be charged to preset levels for dynamic range control, damping of oscillation and discharge between frames, if desired.

Surface 34 of MEMS element 54 (i.e., the surface facing image sensor 16) may be reflective so that visible light illuminating surface 34 is reflected from the MEMS element 54 towards the detection surface of image sensor 16. MEMS element 54 can have a flat surface as shown in FIG. 4 or can be formed to have a concave surface as shown in FIG. 5 so that reflected portions of light 66 are focused into a small area on image sensor 16.

In the example of FIG. 5, metal layer 62 is supported on multiple corners by support structure 74. Structures 74 may be rigid structures so that metal layer 62 bends into a curved shape due to forces resulting from the increased charge on layer 62. However, this is merely illustrative. If desired, layer 62 may be secured at one corner, at two corners, at three corners, along one edge, along two edges, along three edges or in any suitable configuration so that layer 62 changes shape and/or position in response to infrared light 52 that has been absorbed by material 56.

Figure 6:
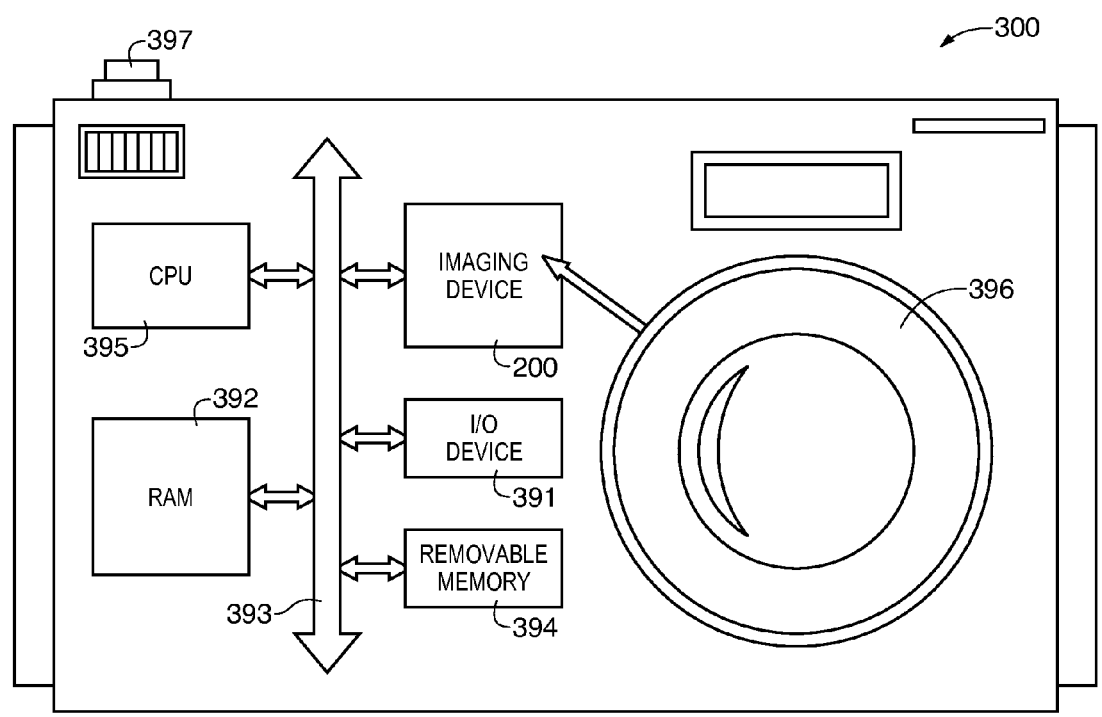
FIG. 6 is a block diagram of a processor system that may include a camera module of the type shown in FIG. 2 in accordance with an embodiment of the present invention.

FIG. 6 shows in simplified form a typical processor system 300, such as a digital camera, which includes an imaging device such as imaging device 200. Imaging device 200 may, for example, be an optical and infrared imaging system such as camera module 12. Processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating an optical and infrared imaging system. The optical and infrared imaging system may be used separately as an optical imaging system and as an infrared imaging system, or may be switched between optical and infrared imaging modes of operations.

The system may include an image sensor such as a CMOS image sensor for capturing images using visible light. Optical images may be captured using an optical lens and one or more mirrors and/or beam splitters to direct visible light on the image sensor. Infrared images may be generated using a microelectromechanical systems (MEMS) array. The MEMS array may be mounted in front of the image sensor. The MEMS array may include an array of MEMS elements that absorb infrared light and change position and/or shape in response to the absorbed infrared light. Each MEMS element may include infrared absorbing material on a metal structure. The infrared absorbing material may generate heat and/or electric charge in response to the absorbed infrared light.

An infrared lens may be configured to focus an infrared image of a scene onto a first surface of the MEMS array. A light source may be used to illuminate an opposing surface of the MEMS array. The image sensor may be configured to capture images of the illuminated opposing surface of the MEMS array. Processing circuitry may be provided that generates an infrared image of a scene using the visible light images of the MEMS array.

The foregoing is merely illustrative of the principles of this invention which can be practiced in other embodiments.

What is claimed is:

1. An imaging system, comprising:
   an image sensor;
   a microelectromechanical systems array mounted over the image sensor, wherein the image sensor is configured to capture images of the microelectromechanical systems array;
   processing circuitry configured to generate an infrared image of a scene using the captured images of the microelectromechanical systems array; and
   an optical lens that focuses light from the scene onto the image sensor via the beam splitter, wherein the microelectromechanical systems array comprises microelectromechanical systems elements each comprising:
      a first metal layer;
      a second metal layer on the first metal layer; and
      a patterned layer of infrared light absorbing material in thermal contact with the second metal layer.

2. The imaging system defined in claim 1 wherein the image sensor comprises a complementary-metal-oxide-semiconductor image sensor.

3. The imaging system defined in claim 2 wherein the microelectromechanical systems array has a first surface and an opposing second surface and wherein the first surface is configured to absorb infrared light from the scene and wherein the image sensor faces the opposing second surface.

4. The imaging system defined in claim 3, further comprising a light source.

5. The imaging system defined in claim 4 wherein the light source is configured to illuminate the opposing second surface.

6. The imaging system defined in claim 5, further comprising a beam splitter interposed between the microelectromechanical systems array and the image sensor that directs light from the light source onto the opposing second surface.

7. The imaging system defined in claim 6 wherein the image sensor is configured to capture the images of the microelectromechanical systems array using a portion of the light from the light source that has passed through the beam splitter.

8. The imaging system defined in claim 7 wherein the light source comprises a light-emitting diode.

9. The imaging system defined in claim 8, further comprising a lens that focuses the light from the light source onto the beam splitter.

10. The imaging system defined in claim 9, further comprising an infrared lens that focuses the infrared light from the scene onto the first surface of the microelectromechanical systems array.

11. An optical and infrared imaging system, comprising:
    an image sensor;
    an optical lens;
    a microelectromechanical systems array; and
    a plurality of beam splitters that directs light from the optical lens and the microelectromechanical systems array onto the image sensor, wherein the beam splitters direct light from the optical lens to the image sensor in a first mode of operation and from the optical lens away from the image sensor in a second mode of operation.

12. The optical and infrared imaging system defined in claim 11 wherein, in the second mode of operation, the plurality of beam splitters directs light from the microelectromechanical systems array onto the image sensor.

13. The optical and infrared imaging system defined in claim 11, further comprising an infrared lens that focuses infrared light onto the microelectromechanical systems array.

14. A system, comprising:
    a central processing unit;
    memory;
    input-output circuitry; and
    an imaging device, wherein the imaging device comprises:
       an image sensor, and
       a microelectromechanical systems array mounted over the image sensor, wherein the image sensor is configured to capture images of the microelectromechanical systems array, wherein the central processing unit is configured to generate infrared images of a scene using the captured images of the microelectromechanical systems array, and wherein the microelectromechanical systems array comprises microelectromechanical systems elements each comprising:
          a metal layer;
          a patterned layer of infrared light absorbing material on the metal layer; and
          an electrode that is stationary with respect to the image sensor and that is mounted directly under the metal layer at a distance from the metal layer, wherein the metal layer completely overlaps the electrode, and wherein the electrode is separate from the metal layer.

15. The system defined in claim 14, further comprising a lens, wherein the microelectromechanical systems array is interposed between the lens and the image sensor.

16. The system defined in claim 15, further comprising a light source that illuminates a surface of the microelectromechanical systems array, wherein the surface faces the image sensor.

* * * * *